(12) United States Patent
Sugimae et al.

(10) Patent No.: US 9,424,915 B2
(45) Date of Patent: *Aug. 23, 2016

(54) NON-VOLATILE SEMICONDUCTOR MEMORY DEVICE

(71) Applicant: KABUSHIKI KAISHA TOSHIBA, Minato-ku (JP)

(72) Inventors: Kikuko Sugimae, Yokohama (JP); Reika Ichihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/334,377

(22) Filed: Jul. 17, 2014

(65) Prior Publication Data

US 2014/0328110 A1 Nov. 6, 2014

Related U.S. Application Data

(63) Continuation of application No. 13/601,570, filed on Aug. 31, 2012, now Pat. No. 8,804,401.

(30) Foreign Application Priority Data

Mar. 26, 2012 (JP) .................................. 2012-068914

(51) Int. Cl.
*G11C 11/16* (2006.01)
*G11C 13/00* (2006.01)

(52) U.S. Cl.
CPC ....... *G11C 13/0002* (2013.01); *G11C 13/0011* (2013.01); *G11C 13/0064* (2013.01); *G11C 13/0069* (2013.01); *G11C 2213/71* (2013.01); *G11C 2213/73* (2013.01)

(58) Field of Classification Search
CPC ........................... G11C 13/0069; G11C 11/16

USPC .................................................. 365/148, 158
See application file for complete search history.

(56) References Cited

U.S. PATENT DOCUMENTS 5,475,249 A 12/1995 Watsuji et al.
6,134,140 A 10/2000 Tanaka et al.
(Continued)

FOREIGN PATENT DOCUMENTS

JP 6-68688 3/1994
JP 11-176175 7/1999
(Continued)

OTHER PUBLICATIONS

Office Action issued Apr. 30, 2014 in Japanese Patent Application No. 2012-068914, filed Mar. 26, 2012 (with English translation).
(Continued)

*Primary Examiner* — Michael Tran
(74) *Attorney, Agent, or Firm* — Oblon, McClelland, Maier & Neustadt, L.L.P.

(57) ABSTRACT

A non-volatile semiconductor memory device includes a cell array layer including a first wire, a memory cell, and a second wire, and a control circuit. When performing set operation for setting the memory cell to a low resistance state, until a resistance value of the memory cell becomes lower than a predetermined resistance value, the control circuit repeating: applying a first voltage for setting to the memory cell; and a verify read verifying that the resistance value of the memory cell has become lower than the predetermined resistance value. After the verify read, the control circuit applies a second voltage having a different polarity from the first voltage to the memory cell before applying the first voltage that follows.

20 Claims, 9 Drawing Sheets

(56) References Cited

U.S. PATENT DOCUMENTS

| | | |
|---|---|---|
| 6,657,898 B2 | 12/2003 | Hirano |
| 6,995,999 B2 | 2/2006 | Morimoto |
| 7,535,764 B2 | 5/2009 | Chin et al. |
| 7,948,796 B2 | 5/2011 | Fujimura et al. |
| 8,077,497 B2 * | 12/2011 | Ogata .......................... 365/148 |
| 8,325,508 B2 * | 12/2012 | Kawai et al. ................. 365/148 |
| 8,355,291 B2 * | 1/2013 | Kim et al. ..................... 365/222 |
| 8,451,648 B2 | 5/2013 | Kamoshida et al. |
| 2010/0235714 A1 | 9/2010 | Toda |
| 2012/0069633 A1 | 3/2012 | Katoh |

FOREIGN PATENT DOCUMENTS

| | | |
|---|---|---|
| JP | 2003-196986 | 7/2003 |
| JP | 2009-158094 | 7/2009 |
| JP | 2009-301607 | 12/2009 |
| JP | 2010-218599 | 9/2010 |
| JP | 2012-69221 | 4/2012 |
| JP | 5133471 | 11/2012 |
| WO | WO 2012/127718 A1 | 9/2012 |

OTHER PUBLICATIONS

Taiwanese Office Action issued Feb. 4, 2015 in Patent Application No. 101132199 (with English Translation).

Chinese Office Action issued Aug. 4, 2015 in Patent Application No. 201210332592.8 (with English Translation).

\* cited by examiner

ADDITIONAL SET SEQUENCE

ADDITIONAL SET SEQUENCE

ADDITIONAL SET SEQUENCE

NON-VOLATILE SEMICONDUCTOR MEMORY DEVICE

CROSS-REFERENCE TO RELATED APPLICATIONS

This application is a continuation of U.S. application Ser. No. 13/601,570 filed Aug. 31, 2012 and, which is based upon and claims the benefit of priority from the prior Japanese Patent Application No. 2012-068914, filed on Mar. 26, 2012, the entire contents of each of which are incorporated herein by reference.

FIELD

Embodiments described herein relate to a non-volatile semiconductor memory device.

BACKGROUND

Description of the Related Art

As a memory storing large volumes of data for use, a resistance variable memory (ReRAM: Resistive RAM), which can be easily formed into three dimensions, draws attention. Such a resistance variable memory is characterized by asymmetry properties in which voltage-current characteristics vary significantly depending on a direction of voltage to be applied to a memory cell.

On the other hand, in order to make data rewritable in the memory, a resistance state of a variable resistance element included in the resistance variable memory needs to be easily controllable by controlling an external voltage. However, sufficient controllability cannot be achieved in some cases due to dependence on a physical state of a substance forming resistance.

DETAILED DESCRIPTION

A non-volatile semiconductor memory device according to an embodiment includes a cell array including one or more first wires, one or more memory cells, and one or more second wires intersecting to the first wires on the memory cells and a control circuit. The memory cells are stacked on the first wires, brought into a low resistance state by application of voltage of a first polarity, and brought into a high resistance state by application of voltage of a second polarity different from the first polarity. The control circuit is configured to cause the state of the memory cell to transition between the high resistance state and the low resistance state through the first wires and the second wires. When performing set operation for setting the memory cell to the low resistance state, until a resistance value of the memory cell becomes lower than a predetermined resistance value, the control circuit repeats: applying a first voltage for setting to the memory cell; and a verify read verifying that the resistance value of the memory cell has become lower than the predetermined resistance value. After the verify read, the control circuit applies a second voltage having a different polarity from the first voltage is applied to the memory cell before applying the first voltage that follows.

Hereinafter, embodiments of a non-volatile semiconductor memory device will be described with reference to the attached drawings.

First Embodiment

[Overview of Semiconductor Memory Device]

Figure 1:
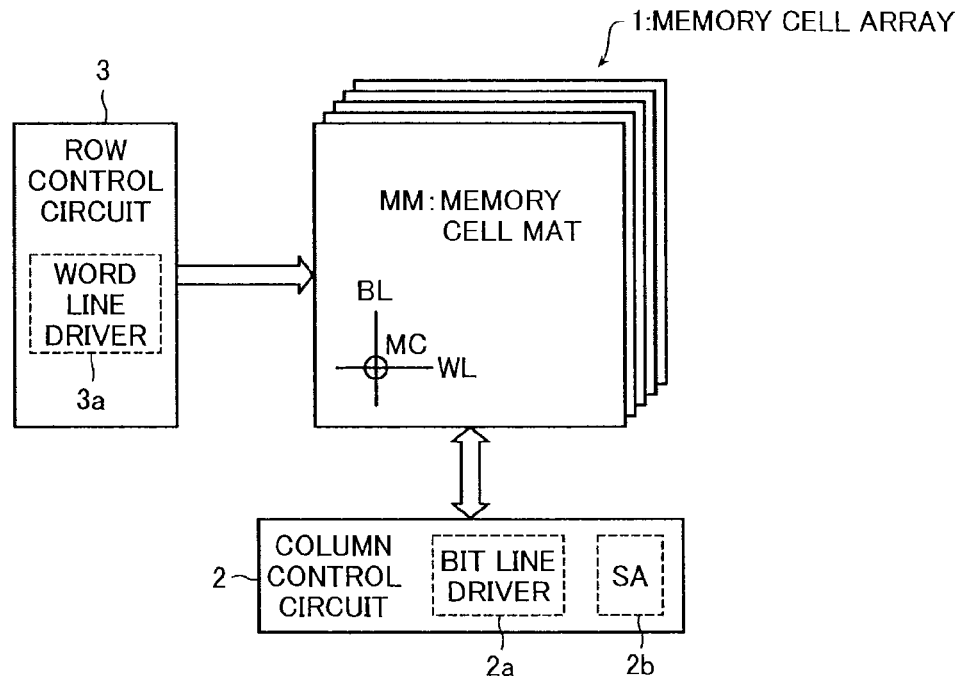
FIG. 1 is a block diagram illustrating an overall configuration of a non-volatile semiconductor memory device according to a first embodiment.

FIG. 1 is a block diagram of a semiconductor memory device according to an embodiment. This semiconductor memory device includes a memory cell array 1, and a column control circuit 2 and a row control circuit 3 that control data erase operation of the memory cell array 1, data write operation to the memory cell array 1, and data read operation from the memory cell array 1. The memory cell array 1 includes a plurality of stacked memory cell mats MM (memory cell layers). Each memory cell mat MM includes a plurality of bit lines BL (first wires) and a plurality of word lines WL (second wires) crossing each other and a memory cell MC connected at each crossing position of the bit lines BL and the word lines WL.

The column control circuit 2 is connected to the bit lines BL of the memory cell mats MM. The column control circuit 2 controls a bit line BL to erase data of a memory cell MC, write data to the memory cell MC, and read data from the memory cell MC. The column control circuit 2 includes a bit line driver 2a including a decoder and a multiplexer for selecting a bit line BL and supplying the bit line BL with voltage required for access operation, and a sense amplifier 2b for detecting and amplifying current flowing in the memory cell MC at the time of read operation to determine data stored in the memory cell MC.

On the other hand, the row control circuit 3 is connected to the word lines WL of the memory cell mats MM. The row control circuit 3 selects a word line WL at the time of access operation. The row control circuit 3 includes a word line driver 3a for supplying the word line WL with voltage required for access operation. The row control circuit 3 as well as the column control circuit 2 is included in an access circuit.

Figure 2:
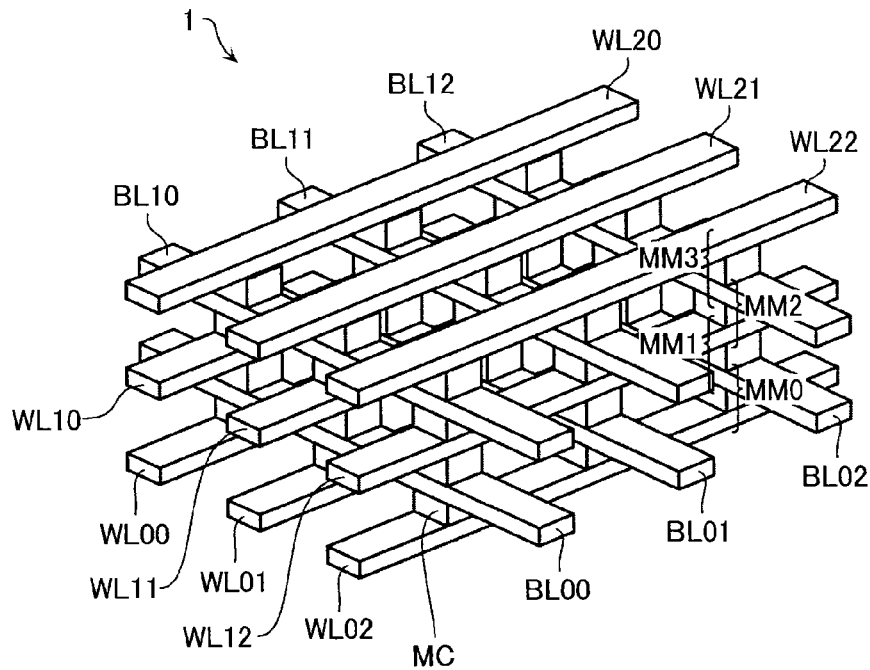
FIG. 2 is a perspective view illustrating a memory cell array structure of the non-volatile semiconductor memory device.

FIG. 2 is a perspective view schematically illustrating a portion of the memory cell array 1.

The memory cell array 1 is a cross point-type memory cell array. Each memory cell mat MM of the memory cell array 1 includes the plurality of bit lines BL arranged in parallel and the plurality of word lines WL arranged in parallel in a direction crossing the bit lines BL. The memory cell MC is arranged at each crossing portion of the bit line BL and the word line WL in such a manner that the memory cell MC is sandwiched between both of the wires. As described above, the memory cell array 1 is formed by stacking the plurality of memory cell mats MM in a multilayered manner. The memory cell mats MM adjacent vertically share the word lines WL or the bit lines BL. In a case of FIG. 2, a memory cell mat MM0 on the lowermost layer of the memory cell array 1 and a memory cell mat MM1 adjacent on the memory cell mat MM0 share bit lines BL00 to BL02. Although pillar-like stacked layer structures of the memory cells MC are formed at crossing portions of the bit lines BL and the word lines WL seen from a stacking direction in a structure shown in FIG. 2, a different structure may be adopted such that a stacked layer structure of the memory cells MC is formed on an entire layer between a bit line layer (a layer in which the plurality of bit lines BL is arranged in a second direction) and a word line layer (a layer in which the plurality of word lines WL is arranged in a first direction).

Figure 3:
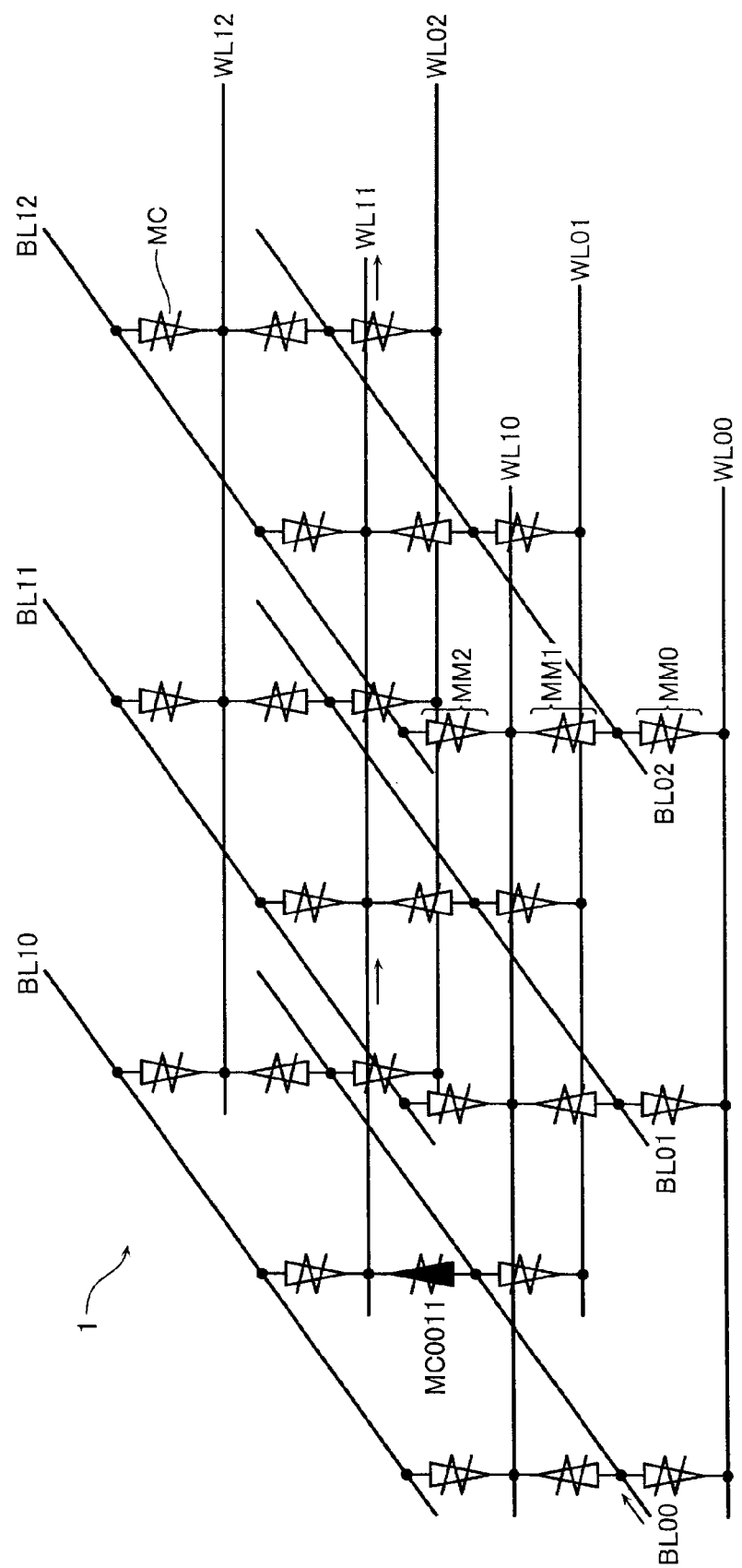
FIG. 3 is an equivalent circuit diagram of the memory cell array.
Figure 4:
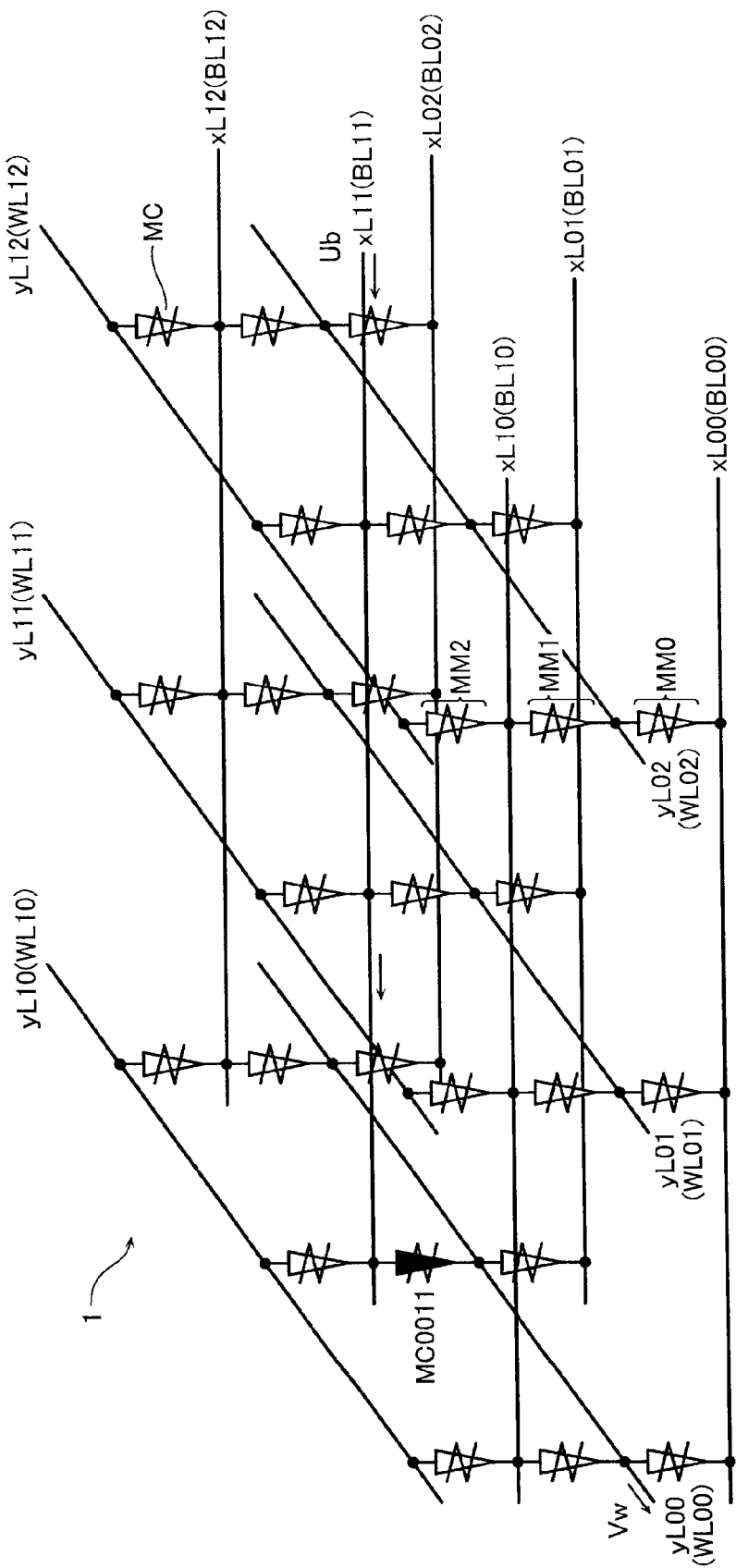
FIG. 4 is an equivalent circuit diagram of another memory cell array.
Figure 5:
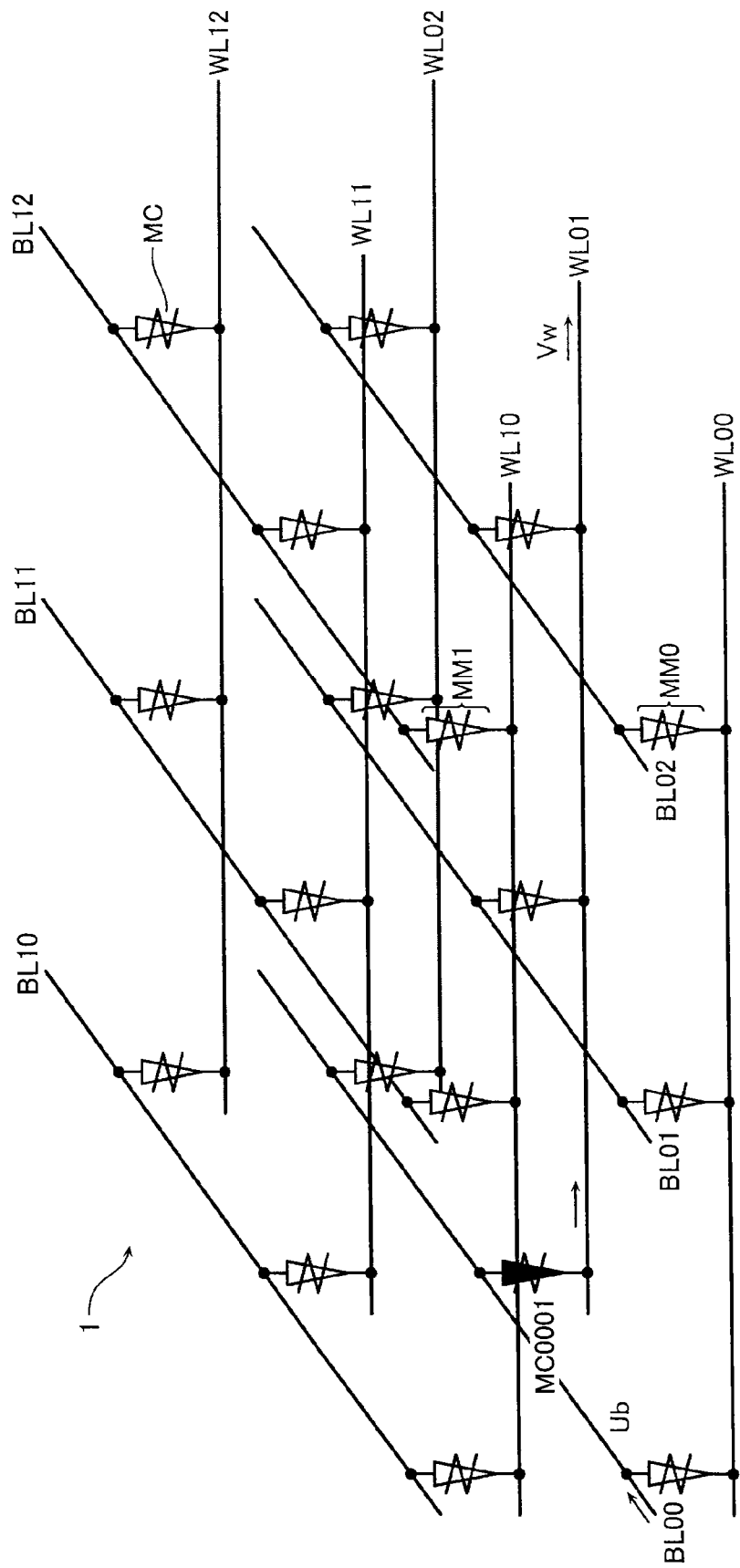
FIG. 5 is an equivalent circuit diagram of another memory cell array.

FIG. 3 is an equivalent circuit diagram of the memory cell array 1 shown in FIG. 2. As described later in detail, each memory cell MC has variable resistance characteristics and non-ohmic characteristics, and a direction in which current flows more is shown with an elongated triangular shape. Thus, a proximal side of the triangle is referred to as an anode while a distal side thereof is referred to as a cathode. When read operation is to be performed on a memory cell MC0011 in FIG. 3, the bit line driver 2a supplies Vread to the bit line BL00 connected to the anode side of the memory cell MC0011, and the word line driver 3a supplies ground voltage Vss to a word line WL11 connected to the cathode side of the memory cell MC0011. As a result, current flows as indicated with arrows in the figure to perform read operation. Further, when set operation is to be performed, the bit line driver 2a applies set voltage Vset to the bit line BL00, and the word line driver 3a applies the ground voltage Vss to the word line WL11. Further, when reset operation is to be performed, the bit line driver 2a applies the ground voltage Vss to the bit line BL00, and the word line driver 3a applies reset voltage Vreset to the word line WL11. What kind of potential is supplied to bit lines BL and word lines WL connected to memory cells MC other than the selected memory cell MC0011 is an important respect, and the selected memory cell MC0011 needs to be accessible reliably. Note that, although a current rectifying direction is reversed per memory cell mat MM in the memory cell array 1 according to the present embodiment, all the memory cell mats MM can have the same current rectifying direction as shown in FIG. 4. Further, although memory cell mats MM share bit lines BL and word lines WL in the memory cell array 1 according to the present embodiment, bit lines BL and word lines WL may be formed independently per memory cell mat MM, and memory cell mats MM may be insulated in between, as shown in FIG. 5.

Figure 6:
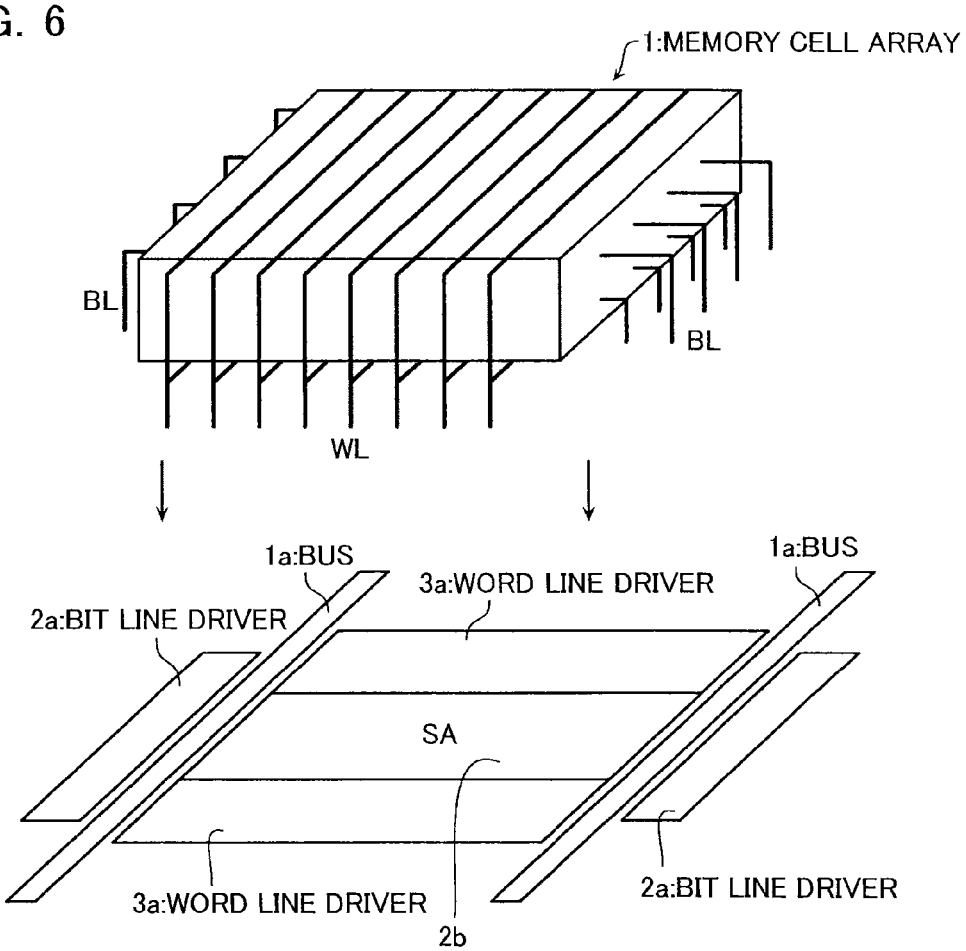
FIG. 6 is a perspective view illustrating a configuration example of a peripheral circuit of the non-volatile semiconductor memory device.

In order to configure a three-dimensional memory with use of the aforementioned cross point-type memory cell array 1, each memory cell array 1 needs to be provided with a sense amplifier, a driver, a decoder, a multiplexer and the like as shown in FIG. 1 as a peripheral circuit that accesses the three-dimensional memory. An example of this configuration is shown in FIG. 6.

In the example in the figure, four sides of the memory cell array 1 are vertical wiring areas for wiring from the bit lines BL and the word lines WL of the memory cell array 1 to a board circuit. The column control circuit 2 and the row control circuit 3 that access the memory cell array 1 are provided on a board below the memory cell array 1 as shown in the figure. The bit line drivers 2a are arranged at positions corresponding to both end portions of the memory cell array 1 in a direction of the bit lines BL. The sense amplifier 2b is arranged at the center on the lower side of the memory cell array 1. The word line drivers 3a are arranged at positions corresponding to both end portions of the memory cell array 1 in a direction of the word lines WL. Buses 1a are arranged between the sense amplifier 2b and the word line drivers 3a, and the bit line drivers 2a. Accordingly, a chip area of this semiconductor memory device can be approximately equal to an area of the memory cell array 1.

The bit line drivers 2a and the word line drivers 3a select a bit line BL and a word line WL in accordance with an address signal and a command from outside and set voltage at predetermined levels to the selected bit line BL and word line WL. Between the bit line drivers 2a and the sense amplifier 2b, data is transferred via the buses 1a as parts of a global bus area.

[Memory Cell]

Subsequently, the memory cell MC according to the present embodiment will be described. Note that, although a memory cell using a CBRAM (Conduction Bridge RAM) as a representative resistance variable memory element will be described herein, a configuration of the memory cell does not matter as long as the element can be varied between a low-resistance state and a high-resistance state depending on voltage to be applied and its polarity and can hold the state to some extent. Such element may be, for example, a chalcogenide compound, a metal oxide crystal, an MRAM element using resistance variation by a tunnel magnetoresistance effect, and a polymeric ferroelectric RAM (PFRAM) in which a resistance element is formed of a conductive polymer. Further, since the resistance variable element alone does not always cause asymmetry properties of current characteristics to the polarity of applied voltage to appear sufficiently, a configuration positively including a configuration with diode characteristics is considered herein. However, an element with diode characteristics does not have to be included in the configuration. In a case where the resistance variable element itself has the diode characteristics, the characteristic portion can be separately regarded as a diode.

Figure 7:
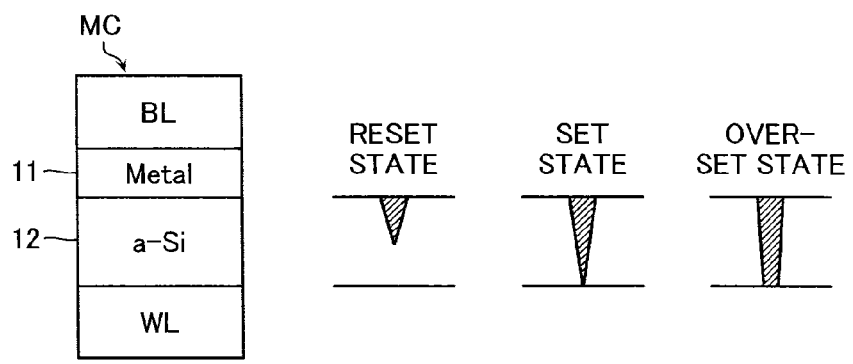
FIG. 7 is a set of diagrams illustrating a configuration example and a characteristics example of a memory cell of the non-volatile semiconductor memory device.

FIG. 7 illustrates a configuration and characteristics of the memory cell MC according to an embodiment. The memory cell MC includes a metal layer 11 and an amorphous silicon layer 12 that are arranged between the bit line BL and the word line WL in this order from a side of the bit line BL, as shown in the leftmost schematic structural diagram in FIG. 7. The metal layer 11 functions as a source for generating metal ions. The amorphous silicon layer 12 serves as a medium for the growth of a metal filament. Note that a p-type doped polysilicon layer or an n-type doped polysilicon layer may also be formed between the amorphous silicon layer 12 and the word line WL. Alternatively, a diode may be formed between the amorphous silicon layer 12 and the word line WL.

Note that, although the amorphous silicon layer 12 is used in the structural diagram in FIG. 7, it is not limited to a semiconductor but may be an insulating film such as silicon oxide (SiOx), silicon oxynitride (SiOxNy), silicon nitride (SiNx), or a metal oxide film. Further, the amorphous silicon layer 12 may be a stacked layer structure of these insulating films such as a stacked layer structure of amorphous silicon and silicon oxide. Further, the WL in the structural diagram in FIG. 7 has only to function as an electrode and may be a p-type doped polysilicon layer 13, an n-type doped polysilicon, or a metal.

The right side of the structural diagram in FIG. 7 shows a schematic diagram for several cell states as a diagram schematically illustrating states and configurations of the memory cell MC. The metal filament is expressed in a downward vertically-long triangle. As for the memory cell MC, a side of the bit line BL is referred to as an anode while a side of the word line WL is referred to as a cathode.

In the memory cell MC in a reset state, the filament formed in the memory cell MC does not penetrate the amorphous silicon layer 12 and is in a high-resistance state. When set voltage is applied in a positive direction to the memory cell MC in the reset state, the filament penetrates the amorphous silicon layer 12, and the memory cell MC would be in a set state or a low-resistance state. Hereinafter, applying set voltage to the memory cell MC in the reset state to get the memory cell MC into the set state is referred to as set operation.

In the set operation of the related art, the set voltage is applied to the memory cell MC, verify voltage is applied to verify whether or not the resistance of the memory cell MC has been changed by measuring the resistance value of the memory cell MC, and the set voltage is reapplied to the memory cell MC when the set operation has not been completed. However, when the set voltage is repeatedly applied to the memory cell MC in this manner, the amount of ions drawn into the amorphous silicon layer 12 from the metal layer 11 would increase as shown in the rightmost figure in FIG. 7, possibly causing an over-set state in which the filament is strongly connected to the word line WL. Once brought into the over-set state, the memory cell MC may not return to the reset state even if backward voltage (reset voltage) is applied thereto.

[Set Operation]

Figure 8:
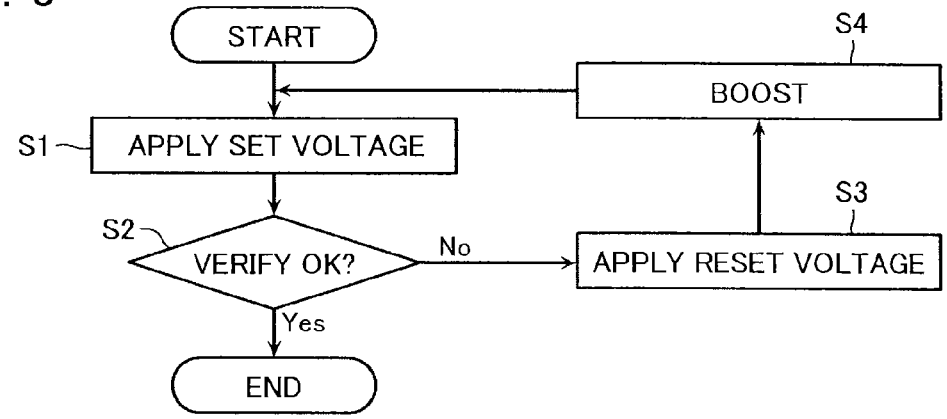
FIG. 8 is a flowchart illustrating set operation of the non-volatile semiconductor memory device.
Figure 9:
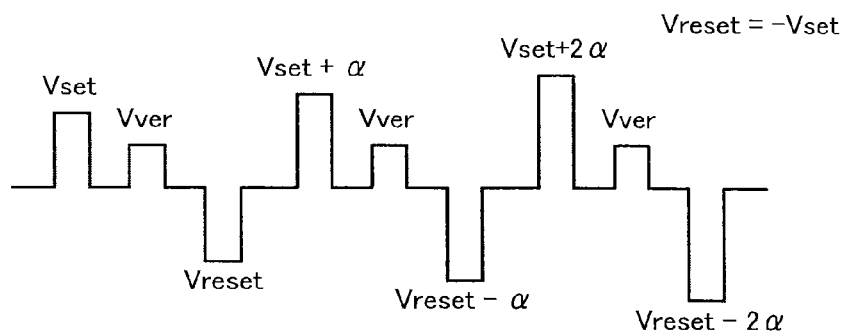
FIG. 9 is a voltage waveform diagram illustrating the set operation of the non-volatile semiconductor memory device.

Now, based upon the above respects, the set operation of the non-volatile semiconductor memory device according to the present embodiment will be described with reference to FIGS. 8 and 9. FIG. 8 is a flowchart illustrating the set operation of the non-volatile semiconductor memory device according to the present embodiment, and FIG. 9 is a voltage pulse waveform illustrating the set operation.

In the set operation of the non-volatile semiconductor memory device according to the present embodiment, in order to prevent the memory cell MC from being brought into the aforementioned over-set state, the set voltage Vset is applied to the memory cell MC (step S1), verify read voltage Vver is applied to perform verify read (step S2), and the reset voltage Vreset of a polarity different from that of the set voltage Vset is applied to the memory cell when the resistance value of the memory cell MC is greater than a predetermined resistance value (step S3). Then, the set voltage Vset is boosted by a predetermined amount ($\alpha$) (step S4) and reapplied to the memory cell MC. When the completion of the set operation is not verified in the verify read (step S2), $-(Vset+\alpha)$ is applied as the reset voltage Vreset (step S3). After that, the set voltage and the reset voltage would be repeatedly applied while sequentially increasing an amplitude of the voltages by $\alpha$ until the completion of the set operation is verified in the verify operation. When set voltage $Vset+n\alpha$ (n indicates 0, 1, 2, ... ) is applied to the memory cell MC a plurality of times in the present embodiment, the metal ions once drawn out of the metal layer 11 return to the metal layer 11 by applying reset voltage $Vreset-n\alpha$ to the memory cell MC in the intervals, thereby preventing the memory cell MC from being in the over-set state.

Note that, in the present embodiment, the magnitude of the set voltage Vset and the magnitude of the reset voltage |Vreset| are equal and increase by the same amount in step S4. That is, the set voltage $Vset+n\alpha$ and the reset voltage $|Vreset|+n\alpha$ are always equal within the same write cycle (steps S1 to S4).

Second Embodiment

Now, a non-volatile semiconductor memory device according to a second embodiment will be described. The non-volatile semiconductor memory device according to the present embodiment is fundamentally the same as the non-volatile semiconductor memory device according to the first embodiment but is different in a method of applying the set voltage.

Figure 10:
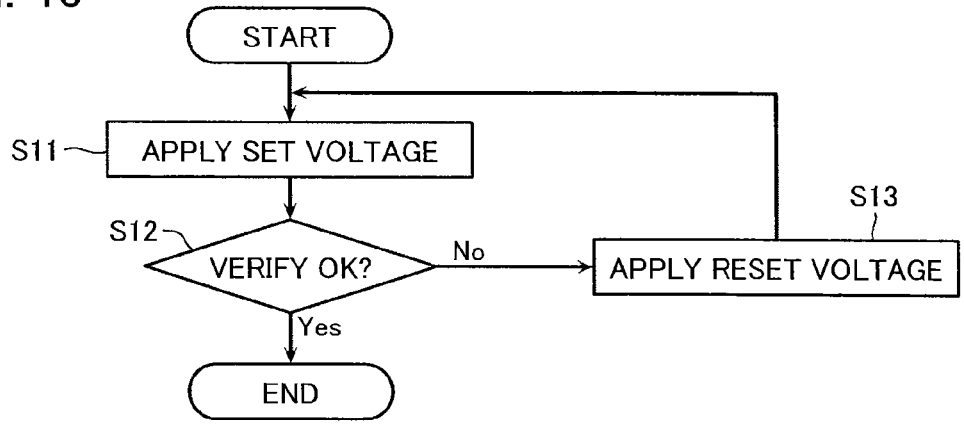
FIG. 10 is a flowchart illustrating set operation of a non-volatile semiconductor memory device according to a second embodiment.
Figure 11:
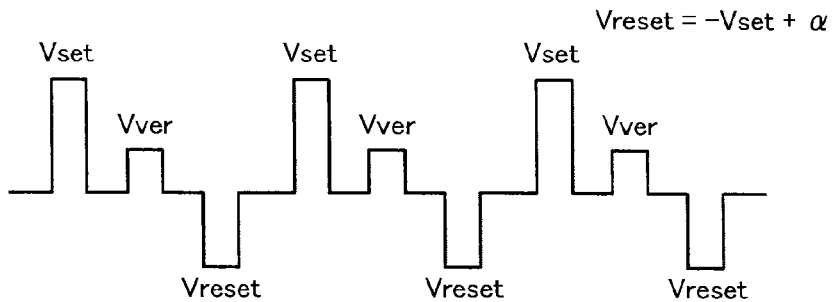
FIG. 11 is a voltage waveform diagram illustrating the set operation of the non-volatile semiconductor memory device.

FIG. 10 is a flowchart illustrating set operation of the non-volatile semiconductor memory device according to the present embodiment, and FIG. 11 is a voltage pulse waveform illustrating the set operation. In the present embodiment, the amplitude of reset voltage |Vreset| is set smaller than that of set voltage Vset. Further, the set voltage Vset is applied to the memory cell MC (step S11), verify read is executed (step S12), reset voltage Vreset of a polarity different from that of the set voltage Vset is applied to the memory cell when the resistance value of the memory cell MC is greater than a predetermined resistance value (step S13), and the set voltage Vset is reapplied to the memory cell MC without adjusting the set voltage Vset and the reset voltage Vreset.

In the present embodiment, the amount of metal ions drawn out of a metal layer 11 in step S11 is considered to be greater than the amount of the metal ions drawn back to the metal layer 11 in step S13, since the amplitude of the reset voltage |Vreset| is set smaller than that of the set voltage Vset. Note that the amplitude relation between the set voltage Vset and the reset voltage Vreset can be adjusted as appropriate according to the material, size and the like of the memory cell MC.

Although the set voltage Vset and the reset voltage Vreset are always fixed in write operation in the present embodiment, the set voltage Vset may be increased or the reset voltage Vreset may be increased or decreased, for example.

Third Embodiment

Now, a non-volatile semiconductor memory device according to a third embodiment will be described. In the first and second embodiments, the set voltage and the reset voltage are applied for the same duration in each write cycle. In the present embodiment, the duration for which the set voltage and the reset voltage are applied is increased by increments for each write cycle.

Figure 12:
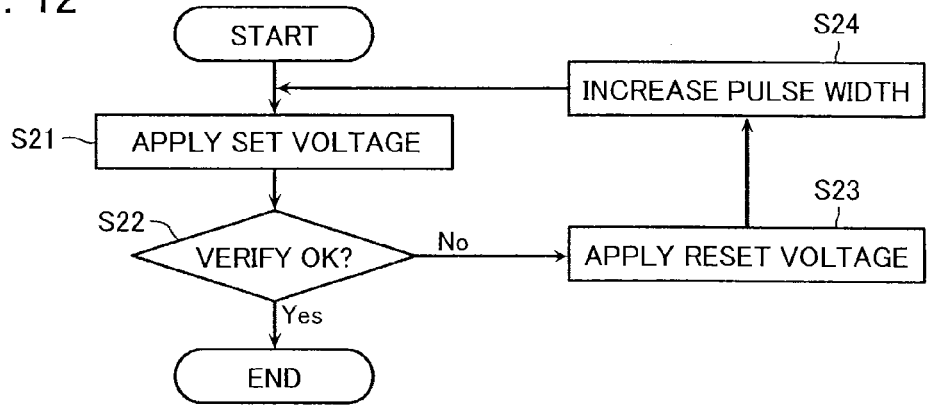
FIG. 12 is a flowchart illustrating set operation of a non-volatile semiconductor memory device according to a third embodiment.
Figure 13:
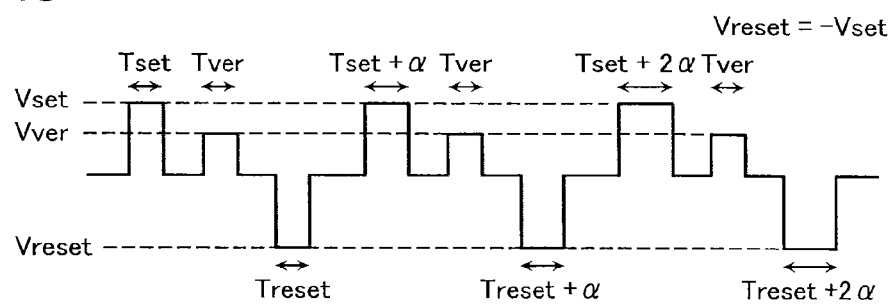
FIG. 13 is a voltage waveform diagram illustrating the set operation of the non-volatile semiconductor memory device.

FIG. 12 is a flowchart illustrating set operation of a non-volatile semiconductor memory device according to the present embodiment, and FIG. 13 is a voltage pulse waveform illustrating the set operation. In the present embodiment, set voltage Vset is applied to the memory cell MC for the duration of a set voltage application time Tset (step S21), verify read voltage Vver is applied for the duration of a verify voltage application time Tver to perform verify read (step S22), and reset voltage Vreset (=−Vset) is applied to the memory cell for the duration of a reset voltage application time Treset when the resistance value of the memory cell MC is greater than a predetermined resistance value (step S23). Then, the set voltage application time Tset, the verify voltage application time Tver, and the reset voltage application time Treset (hereinafter referred to as a pulse width) are increased by a predetermined amount ($\alpha$) (step S24) to reapply the voltages to the memory cell MC. When the completion of the set operation is not verified in the verify read (step S22), the reset voltage Vreset is applied for the duration of the reset voltage application time Treset (step S23). After that, the set voltage and the reset voltage would be repeatedly applied while sequentially increasing the pulse widths by $\alpha$ until the completion of the set operation is verified in the verify operation. By such method, the effect similar to that of the first and second embodiments can be attained.

Fourth Embodiment

Figure 14:
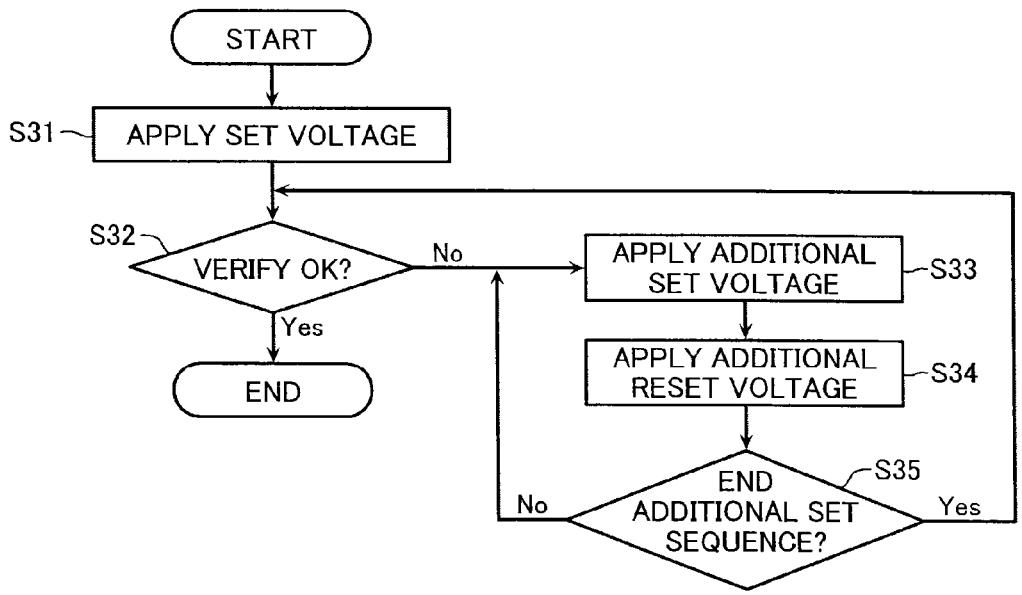
FIG. 14 is a flowchart illustrating set operation of a non-volatile semiconductor memory device according to a fourth embodiment.
Figure 15:
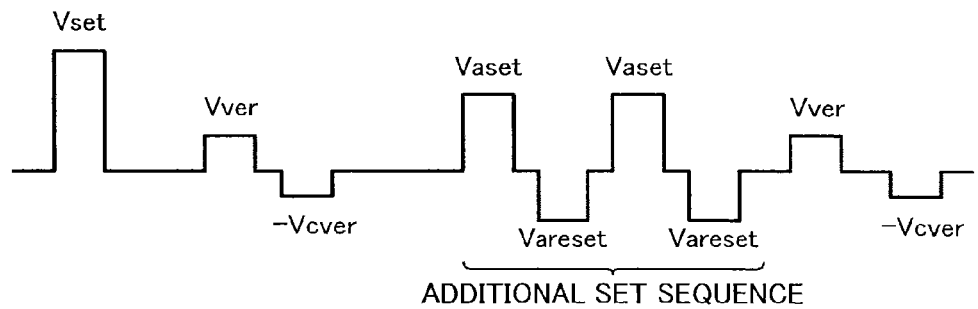
FIG. 15 is a voltage waveform diagram illustrating the set operation of the non-volatile semiconductor memory device.
Figure 16:
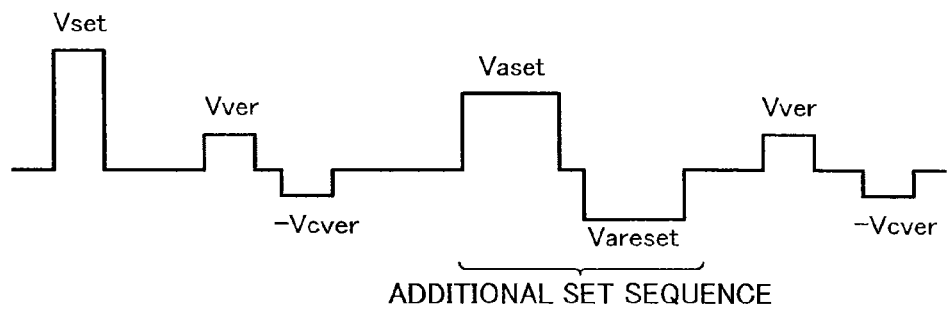
FIG. 16 is a voltage waveform diagram illustrating another set operation of the non-volatile semiconductor memory device.
Figure 17:
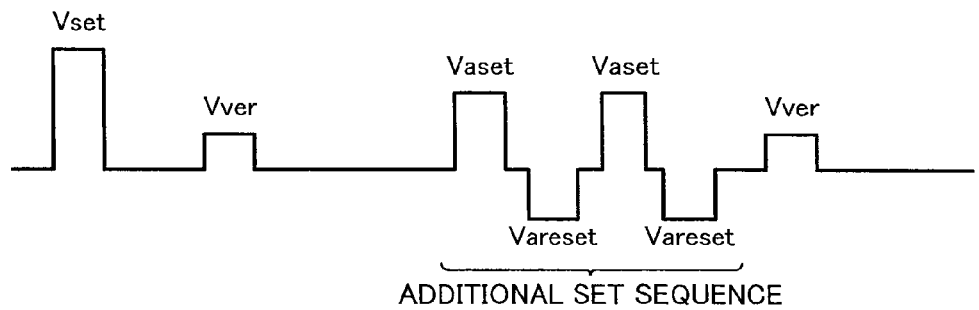
FIG. 17 is a voltage waveform diagram illustrating another set operation of the non-volatile semiconductor memory device.

Now, a fourth embodiment will be described with reference to FIGS. 14 to 17. FIG. 14 is a flowchart illustrating set operation of a non-volatile semiconductor memory device according to the fourth embodiment, and FIGS. 15 to 17 are voltage pulse waveforms illustrating the set operation. In the set operation of the present embodiment, set voltage Vset is applied to a selected memory cell MC (step S31), and verify operation is executed (step S32). When the resistance value of the selected memory cell MC is greater than a predetermined resistance value, an additional set sequence would be repeated until the resistance value of the selected memory cell MC becomes lower than the predetermined resistance value (steps S32 to S35). According to the set operation of the present embodiment, it is considered that an even finer filament can be formed and that an over-set state can be prevented more effectively.

The additional set sequence is performed by alternately applying additional set voltage Vaset and additional reset voltage Vareset to the selected memory cell MC the predetermined number of times (steps S33 to S35). Here, as shown in FIG. 15, the absolute value of the additional set voltage Vaset may be set approximately equal to the absolute value of the set voltage Vset or smaller than the set voltage Vset and greater than the absolute value of verify read voltage Vver. Further, the amplitude of the additional set voltage Vaset can be adjusted as appropriate to the extent that the selected memory cell MC would not be in the over-set state. Depending on the circumstances, the amplitudes of the additional set voltage Vaset may be set greater than the set voltage Vset. Although the value of the additional reset voltage Vareset can be adjusted as appropriate, the value needs to be set such that the amount of the filament drawn out to an amorphous silicon layer 12 by the application of the additional set voltage Vaset is greater than the amount of the filament drawn back to a metal layer 11 by the application of the additional reset voltage Vareset. Thus, when the amplitude of forward voltage required for drawing the predetermined amount of the filament out to the amorphous silicon layer 12 is equal to the amplitude of backward voltage required for drawing the predetermined amount of the filament back to the metal layer 11, the amplitude of the additional reset voltage Vareset needs to be set smaller than the magnitude of the additional set voltage Vaset.

The number of times the additional set voltage Vaset and the additional reset voltage Vareset are applied in one additional set sequence can be adjusted as appropriate. For example, each of the additional set and reset voltages may be applied twice as shown in FIG. 15 or once as shown in FIG. 16. It is important that the additional reset voltage Vareset, which is the backward voltage, be applied after the additional set voltage Vaset, which is the forward voltage, is applied. Further, application times (pulse widths) of the additional set voltage Vaset and the additional reset voltage Vareset can be adjusted as appropriate. In an example shown in FIG. 15, the application times are set equal to those of the set voltage Vset and verify read voltage Vver and twice as much in an example shown in FIG. 16. Further, a difference can be set between the application time of the additional set voltage Vaset and the application time of the additional reset voltage Vareset. For example, the application time of the additional set voltage Vaset may be set longer than the application time of the additional reset voltage Vareset.

In the present embodiment, moreover, verify compensation voltage Vcver, which is the backward voltage, may be applied to the memory cell MC after applying the verify read voltage Vver, which is the forward voltage, in the verify operation. The verify compensation voltage Vcver is applied in order to eliminate the influence of the verify operation on the filament. That is, the amplitude of the verify compensation voltage Vcver is set such that the amount of the filament drawn back to the metal layer 11 by the application of the verify compensation voltage Vcver is substantially equal to the amount of the filament drawn out to the amorphous silicon layer 12 by the application of the verify read voltage Vver. Accordingly, the amplitude of the verify read voltage Vver and the amplitude of the verify compensation voltage Vcver are set equal when the amplitude of the forward voltage required for drawing the predetermined amount of the filament out to the amorphous silicon layer 12 is equal to the amplitude of the backward voltage required for drawing the predetermined amount of the filament back to the metal layer 11. Note that, when the influence of the application of the verify read voltage on the filament is to be reduced rather than completely eliminated, the amplitude of the verify compensation voltage Vcver can be set smaller than the amplitude of the verify read voltage Vver. According to such method of verify operation, the influence of the application of the verify read voltage Vver on the filament can be reduced, thereby allowing the even finer filament to be formed.

Further, the verify compensation voltage Vcver does not necessarily have to be applied after the verify read voltage Vver. As shown in FIG. 17, the application of the verify compensation voltage Vcver can be omitted. Further, the verify compensation voltage Vcver can be applied after applying the verify read voltage Vver in the first to third embodiments above.

Note that the magnitudes and the application times (pulse widths) of the additional set voltage Vaset and the additional reset voltage Vareset in the additional set sequence may be fixed or adjusted for each cycle of the additional set sequence.

[Effects on Unselected Memory Cells]

Figure 18:
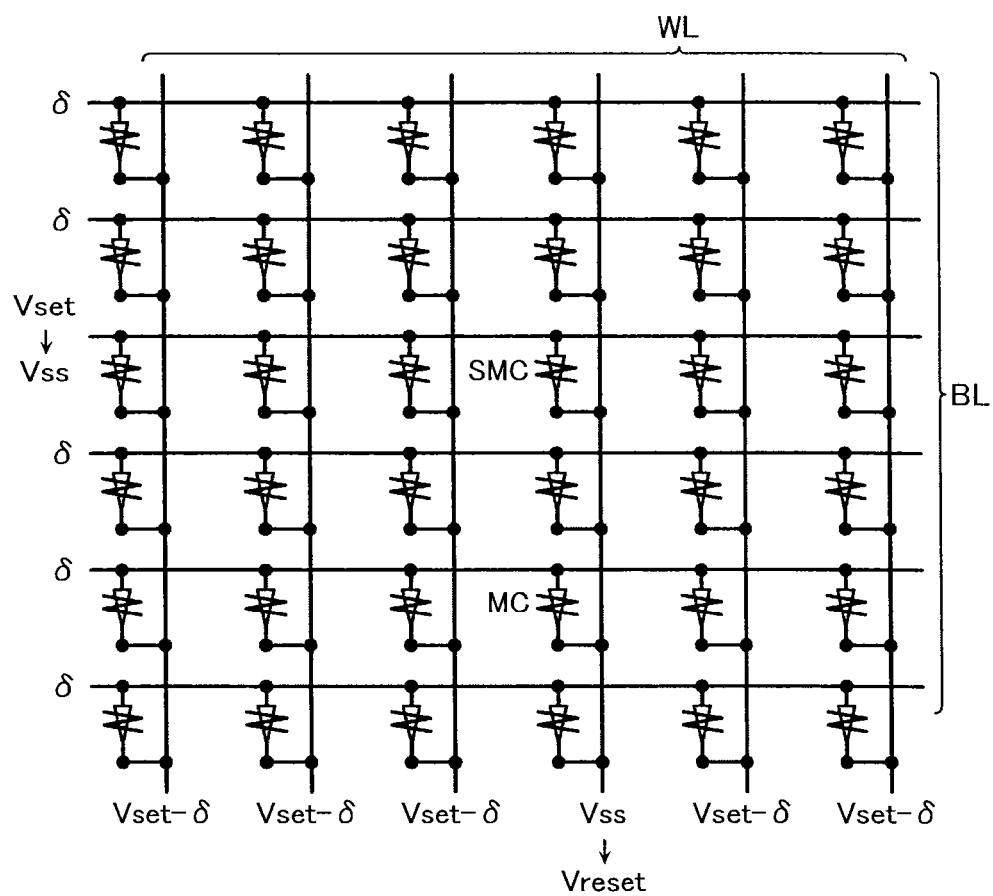
FIG. 18 is an equivalent circuit diagram of the memory cell array illustrating effects on unselected memory cells in the set operations.

Effects on unselected memory cells in the set operation shown in the first to fourth embodiments will be described. In the first to fourth embodiments, as shown in FIG. 18, the set voltage Vset is applied to the selected bit line BL, and the ground voltage Vss is applied to the selected word line WL. If the selected memory cell SMC does not attain the set state, the ground voltage Vss is applied to the unselected bit line BL, and the reset voltage Vreset is applied to the selected word line. While the voltages of the selected bit line BL and the selected word line WL are controlled, voltages of unselected bit lines BL are fixed to δ, and voltages of unselected word lines WL are fixed to Vset−δ. Therefore, a backward voltage of Vset−2δ is applied to memory cells MC connected between the unselected bit line BL and the unselected word line WL.

On the other hand, when the set voltage Vset is applied to the selected memory cell, a forward voltage δ is applied, and when the reset voltage Vreset is applied to the selected memory cell, a backward voltage Vreset−δ is applied to the unselected memory cells connected between the unselected bit line BL and the selected word line WL. The voltage δ is set less than a dead-band voltage Δ. If the dead-band voltage Δ is applied to the memory cell MC, a current flowing in the memory cell MC is less than operation current. Thus, currents flowing in the memory cells connected between the unselected bit line BL and the selected word line WL are not sensed.

Furthermore, when the set voltage Vset is applied to the selected memory cell, a forward voltage δ is applied, and when the reset voltage Vreset is applied to the selected memory cell, a backward voltage Vreset−δ is applied to the unselected memory cells connected between the selected bit line BL and the unselected word line WL. Therefore, the unselected memory cells can be prevented from error resetting if |Vset−δ|<|Vreset| is true.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a memory cell array including one or more first wires, one or more memory cells stacked on the first wires, and one or more second wires intersecting the first wires on the memory cells, the memory cells being two-terminal elements, the memory cells brought into a low resistance state by application of voltage of a first polarity, and brought into a high resistance state by application of voltage of a second polarity different from the first polarity; and
    a control circuit configured to cause the memory cell to transition between the high resistance state and the low resistance state through the first wires and the second wires,
    wherein when performing a set operation for setting the memory cell to the low resistance state so that a resistance value of the memory cell becomes lower than a predetermined resistance value, the control circuit is configured to repeat:
        applying a first voltage of the first polarity to the memory cell;
        a verify read to verify whether the resistance value of the memory cell has become lower than the predetermined resistance value;
        after the verify read, applying a second voltage of the second polarity to the memory cell; and
        if the verify read indicates the resistance value of the memory cell has not become lower than the predetermined resistance value, applying the first voltage again.

2. The non-volatile semiconductor memory device according to claim 1, wherein the control circuit is further configured to increase amplitudes of the first voltage and the second voltage by a predetermined amount every time each first voltage and second voltage is applied to the memory cell.

3. The non-volatile semiconductor memory device according to claim 2, wherein the first voltage and the second voltage applied after the first voltage have a same amplitude.

4. The non-volatile semiconductor memory device according to claim 1, wherein an amplitude of the second voltage is smaller than that of the first voltage by a predetermined amount, and the first voltage and the second voltage have fixed amplitudes regardless of how many times the first and second voltages are applied to the memory cell.

5. The non-volatile semiconductor memory device according to claim 1, wherein the control circuit is further configured to increase a duration for which the first and second voltages are applied by a predetermined amount every time each of the first and second voltages is applied to the memory cell.

6. The non-volatile semiconductor memory device according to claim 1, wherein the control circuit is further configured to, in the verify read, apply a verify compensation voltage of a polarity different from that of a verify read voltage after applying the verify read voltage to the memory cell.

7. The non-volatile semiconductor memory device according to claim 6, wherein the memory cells are Conduction Bridge RAMs.

8. The non-volatile semiconductor memory device according to claim 1, wherein the memory cells comprise a metal layer and an intermediate layer contacting the metal layer.

9. A non-volatile semiconductor memory device comprising:
    a memory cell array including one or more first wires, one or more memory cells stacked on the first wires, and one or more second wires intersecting the first wires on the memory cells, the memory cells being two-terminal elements, the memory cells are brought into a low resistance state by application of voltage of a first polarity, and are brought into a high resistance state by application of voltage of a second polarity different from the first polarity; and a control circuit configured to cause the memory cell to transition between the high resistance state and the low resistance state through the first wires and the second wires;

wherein when performing a set operation for setting the memory cell to the low resistance state, so that a resistance value of the memory cell becomes lower than a predetermined resistance value, after applying a first voltage of the first polarity to the memory cell, the control circuit is configured to:

perform an additional set sequence for an additional set operation on the memory cell by applying an additional set voltage of the first polarity to the memory cell, and then applying an additional reset voltage of the second polarity to the memory cell; and perform a verify read to verify whether the resistance value of the memory cell has become lower than the predetermined resistance value.

10. The non-volatile semiconductor memory device according to claim 9, wherein an amplitude of the additional set voltage is equal to or smaller than an amplitude of the first voltage and greater than a magnitude of a verify read voltage for the verify read.

11. The non-volatile semiconductor memory device according to claim 9, wherein the additional set voltage and the additional reset voltage have a same amplitude.

12. The non-volatile semiconductor memory device according to claim 9, wherein the additional set voltage and the additional reset voltage have a same duration.

13. The non-volatile semiconductor memory device according to claim 9, wherein the control circuit is further configured to apply the additional set voltage and the additional reset voltage a plurality of times.

14. The non-volatile semiconductor memory device according to claim 9, wherein the control circuit is further configured to respectively apply the additional set voltage and the additional reset voltage once.

15. The non-volatile semiconductor memory device according to claim 9, wherein the control circuit is further configured to apply a verify compensation voltage of a polarity different from that of a verify read voltage after applying the verify read voltage to the memory cell.

16. The non-volatile semiconductor memory device according to claim 9, wherein a duration of the additional set voltage is longer than that of the additional reset voltage.

17. The non-volatile semiconductor memory device according to claim 9, wherein the memory cells are Conduction Bridge RAMs.

18. A non-volatile semiconductor memory device comprising:

a memory cell array including one or more first wires, one or more memory cells stacked on the first wires, and one or more second wires intersecting the first wires on the memory cells, the memory cells being two-terminal elements, the memory cells brought into a low resistance state by application of voltage of a first polarity, and brought into a high resistance state by application of voltage of a second polarity different from the first polarity; and a control circuit configured to cause the memory cell to transition between the high resistance state and the low resistance state through the first wires and the second wires, wherein when performing a set operation for setting the memory cell to the low resistance state, the control circuit is configured to:

apply a first voltage for setting to the memory cell; and perform a verify read for verifying whether a resistance value of the memory cell has become lower than a predetermined resistance value, by applying a verify read voltage to the memory cell; and apply a verify compensation voltage of a polarity different from that of the verify read voltage after applying the verify read voltage to the memory cell.

19. The non-volatile semiconductor memory device according to claim 18, wherein the verify read voltage and the verify compensation voltage have a same amplitude.

20. The non-volatile semiconductor memory device according to claim 18, wherein the memory cells are Conduction Bridge RAMs.

* * * * *